(12) United States Patent
Lu et al.

(10) Patent No.: US 8,841,674 B2
(45) Date of Patent: Sep. 23, 2014

(54) FIELD TRANSISTOR STRUCTURE MANUFACTURED USING GATE LAST PROCESS

(75) Inventors: Chao-Yang Lu, Sunnyvale, CA (US); Guang-Jye Shiau, Irvine, CA (US); Akira Ito, Irvine, CA (US)

(73) Assignee: Broadcom Corporaton, Irvine, CA (US)

( * ) Notice: Subject to any disclaimer, the term of this patent is extended or adjusted under 35 U.S.C. 154(b) by 243 days.

(21) Appl. No.: 13/174,083

(22) Filed: Jun. 30, 2011

(65) Prior Publication Data

US 2013/0001574 A1    Jan. 3, 2013

(51) Int. Cl.
H01L 29/78 (2006.01)
H01L 21/28 (2006.01)

(52) U.S. Cl.
USPC .................................................. 257/66

(58) Field of Classification Search
CPC . H01L 29/78; H01L 29/772; H01L 29/42312; H01L 29/42316; H01L 29/66477; H01L 29/66545; H01L 21/823814
USPC ............................ 257/66, E29.255, E21.19
See application file for complete search history.

(56) References Cited

U.S. PATENT DOCUMENTS

| 6,001,714 | A  | * | 12/1999 | Nakajima et al. ............ 438/525 |
| 6,271,568 | B1 |   | 8/2001  | Woodruff et al. |
| 7,180,143 | B2 |   | 2/2007  | Kanegae et al. |
| 2003/0169381 | A1 | * | 9/2003 | Kawachi et al. ............... 349/43 |
| 2004/0110329 | A1 |  | 6/2004 | Joo et al. |
| 2007/0007530 | A1 | * | 1/2007 | Wong et al. ..................... 257/66 |
| 2010/0320561 | A1 |  | 12/2010 | Xia et al. |
| 2011/0057267 | A1 |  | 3/2011 | Chuang et al. |

FOREIGN PATENT DOCUMENTS

| CN | 1591901 A | 3/2005 |
| JP | 2006-253490 | 9/2006 |

OTHER PUBLICATIONS

European Search Report for European Application No. 12 00 4824.4, dated Oct. 10, 2013, 3 pages.
Zhang, et al., "Three-Mask Polycrystalline Silicon TFT with Metallic Gate and Junctions," *IEEE Electron Device Letters*, vol. 4, No. 7 (Jul. 2006).
English-language abstract for: Hiroyuki., JP 2006-253490 (listed on accompanying PTO/SB/08a as document FP1).
Chinese (language) office action received in counterpart Chinese application No. 201210228162.1, dated Jul. 3, 2014 from the State Intellectual Property Office of the P.R.C.; 7 pages.

* cited by examiner

*Primary Examiner* — Whitney T Moore
(74) *Attorney, Agent, or Firm* — Sterne, Kessler, Goldstein & Fox P.L.L.C.

(57) ABSTRACT

According to embodiments of the invention, a field transistor structure is provided. The field transistor structure includes a semiconductor substrate, a metal gate, a polycrystalline silicon (polysilicon) layer, and first and second metal portions. The polysilicon layer has first, second, third, and fourth sides and is disposed between the semiconductor substrate on the first side and the metal gate on the second side. The polysilicon layer is also disposed between the first and second metal portions on the third and fourth sides. According to some embodiments of the present invention, the field transistor structure may also include a thin metal layer disposed between the polysilicon layer and the semiconductor substrate. The thin metal layer may be electronically coupled to each of the first and second metal portions.

23 Claims, 10 Drawing Sheets

FIELD TRANSISTOR STRUCTURE MANUFACTURED USING GATE LAST PROCESS

BACKGROUND

1. Field of Invention

The invention relates to a field transistor gate structure produced according to various foundry production techniques as well as novel processes for producing the field transistor gate structure.

2. Related Art

Due to the exorbitant cost of the equipment required for the production of semiconductor components, many semiconductor companies outsource the actual manufacture of their semiconductor components to specialized semiconductor foundries. While a foundry may have many customers that each require a wide variety of different semiconductor components, it will typically require that each of its customers submit designs consisting of components from standard library in order to facilitate use of a common processes for manufacturing the components for all of its customers.

For some customers the components from the standard library are not sufficient to meet all of their needs. For instance, a customer may wish to use components that are not part of the standard library. However, foundries are often unwilling or unable to alter their process steps on a customer-by-customer basis. Thus, there exists a need for new components manufactured according to existing foundry processes.

BRIEF SUMMARY OF THE INVENTION

According to embodiments of the invention, a field transistor structure is provided. The field transistor structure includes a semiconductor substrate, a metal gate, a polycrystalline silicon (polysilicon) layer, and first and second metal portions. The polysilicon layer has first, second, third, and fourth sides and is disposed between the semiconductor substrate on the first side and the metal gate on the second side. The polysilicon layer is also disposed between the first and second metal portions on the third and fourth sides. According to some embodiments of the present invention, the field transistor structure may also include a thin metal layer (or a combination of multiple different metal layers) disposed between the polysilicon layer and the semiconductor substrate. The thin metal layer may be electronically coupled to each of the first and second metal portions. An inter-layer dielectric (ILD) may also be disposed between the metal gate and the polysilicon layer.

According to embodiments of the invention, a one-time programmable device is provided. The one-time programmable device may include a semiconductor substrate and a plurality of programmable elements formed on the semiconductor substrate. The programmable elements can each include a metal gate, first and second metal portions, and a polysilicon layer. The polysilicon layer has first, second, third, and fourth sides and is disposed between the semiconductor substrate on the first side and the metal gate on the second side. Additionally, the polysilicon layer is disposed between the first and second metal portions on the third and fourth sides. A thin metal layer or a combination of multiple different metal layers may be disposed between the polysilicon layer and the semiconductor substrate. Additionally, the thin metal layer may be electrically coupled to the first and second metal portions. The programmable elements may also include an ILD disposed between the metal gate and the polysilicon layer.

According to embodiments of the invention, a method of making a field transistor structure is provided. The method includes depositing a first dielectric layer on a silicon substrate. A thin metal layer (or a combination of multiple different metal layers) is deposited on top of the first dielectric layer and a polysilicon layer is deposited on top of the thin metal layer. First and second portions are then removed from the polysilicon layer and backfilled with first and second metal portions. A metal gate is deposited on top of the field transistor structure. The method may also include depositing a second dielectric layer between the polysilicon layer and the metal gate according to embodiments of the invention. According to some embodiments the substrate may constitute silicon or silicon with a shallow trench isolation (STI) layer on top.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS/FIGURES

Embodiments of the invention are described with reference to the accompanying drawings. In the drawings, like reference numbers indicate identical or functionally similar elements. Additionally, the left most digit(s) of a reference number identifies the drawing in which the reference number first appears.

The invention will now be described with reference to the accompanying drawings. In the drawings, like reference numbers generally indicate identical, functionally similar.

DETAILED DESCRIPTION OF THE INVENTION

Figure 1A:
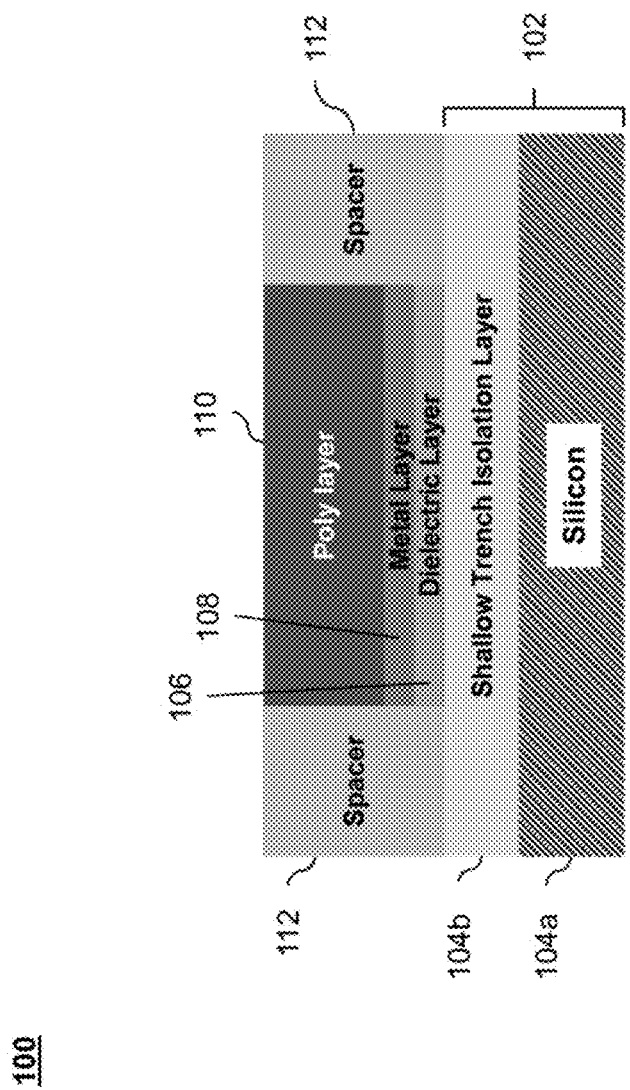
FIG. 1a depicts a partially-completed field transistor structure according to embodiments of the present invention.

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Overview

A flexible field transistor structure is described herein, in addition to the process for making the same. The flexible transistor structure can provide multiple circuit functions from a single transistor structure, including: low performance field effect transistor (FET), fuse or one time programmable memory, and high resistance resistor having a frequency dependent resistance or conductance. Further, the process for making the multi-functional transistor structure is implemented by modifying the gate region processing that is available in conventional foundry processes, for example a 28 nm process that uses a high-K dielectric for gate formation.

Field Transistor Fabrication Process Description

FIGS. 1a-d depict process flow for creating a field transistor gate structure according to embodiments of the present invention.

FIG. 1a depicts a field transistor structure 100 according to embodiments of the present invention. The transistor structure 100 is built on a silicon substrate 102. According to embodiments of the present invention, the silicon substrate may include a silicon layer 104a and a shallow-trench isolation (STI) layer 104b deposited on top of it. Alternatively, the silicon substrate 102 may include the silicon layer 104a without the STI layer 104b. Dielectric layer 106 is disposed on the silicon substrate 102. According to some embodiments, the dielectric layer 106 may comprise a high-k dielectric in order to increase gate capacitance and, therefore, improve the performance of regular transistors located on the same wafer as field transistor structure 100. According to some embodiments, dielectric layer comprises a hi-k dielectric material, oxide, nitride, oxinitride, or any other suitable dielectric material. Additionally, the dielectric layer may include several suitable dielectric materials in combination with one another.

A thin metal layer 108 is deposited on top of the dielectric layer 106. The thickness of the thin metal layer 108 can be adjusted to achieve desired a resistivity; when a lower resistivity is desired, the thickness of the thin metal layer 108 can be increased, and vice versa for a higher resistivity. According to embodiments of the invention, the thin metal layer 108 can comprise titanium, titanium nitride, tantalum, tantalum nitride, aluminum, tungsten, or any other suitable metal or metal alloy. Additionally, the thin metal layer can comprise any combination of suitable metals or metal alloys. The thin metal layer can be deposited by physical vapor deposition (PVD), chemical vapor deposition (CVD), atomic layer deposition (ALD), or any other suitable method of deposition. A polysilicon layer 110 is deposited on top of metal layer 108 according to well-known processes. Preferably, the polysilicon layer is entirely un-doped or very lightly doped (i.e., on the order of $10^{13}$ atoms/cm$^3$). Spacers 112 are also deposited and can be defined by a combination of deposition, lithography, etching, and chemical-mechanical planarization. The spacers 112 are used to electrically isolate the transistor structure 100 from surrounding structures. The spacers 112 are preferably made out of a dielectric material for that purpose.

Figure 1B:
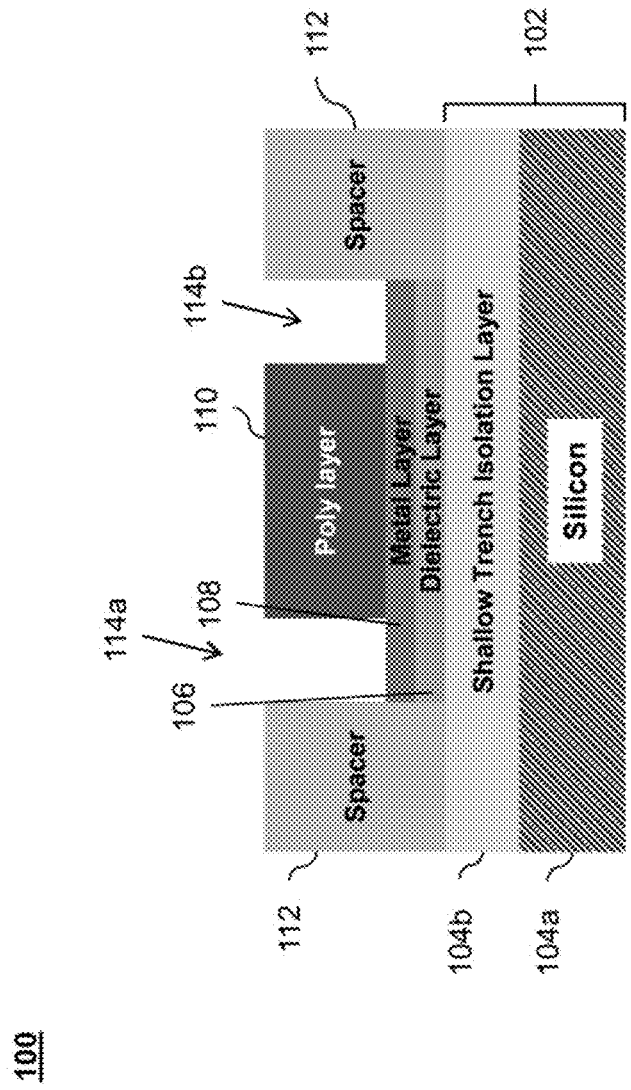
FIG. 1b depicts a partially-completed field transistor structure according to embodiments of the present invention.

FIG. 1b depicts the field transistor structure 100 after a portion of the poly layer 110 has been etched away to form recesses 114a and 114b. While FIG. 1b depicts recesses 114a and 114b extending to the top of metal layer 108, according to some embodiments of the invention, a corresponding portion of the metal layer 108 could also be etched away causing recesses 114a and 114b to extend to the top of dielectric layer 106.

Figure 1C:
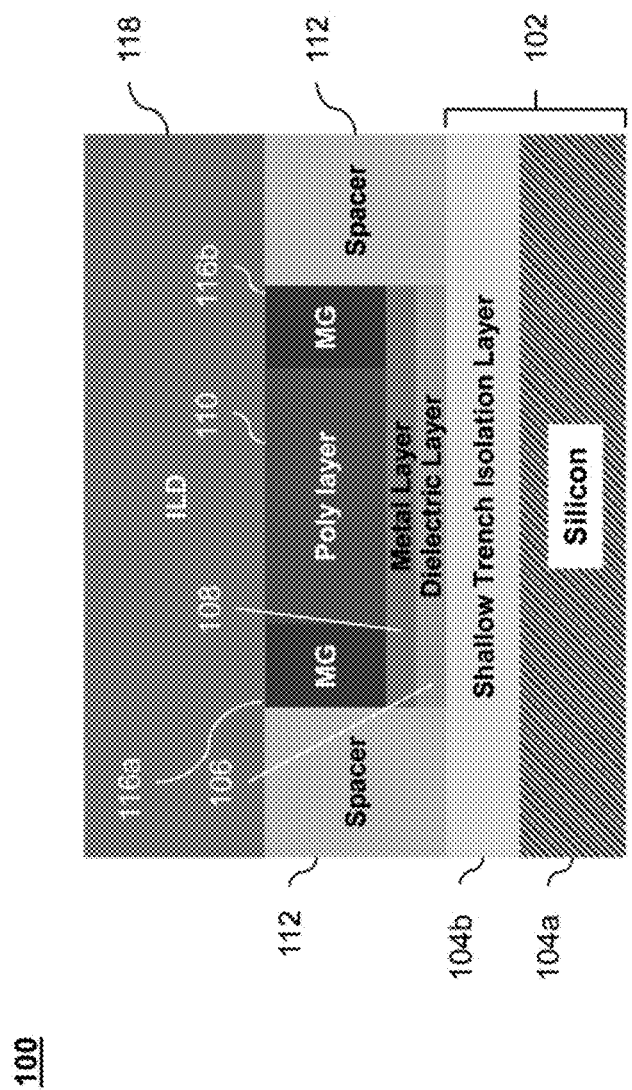
FIG. 1c depicts a partially-completed field transistor structure according to embodiments of the present invention.

As shown in FIG. 1c, the recesses 114a and 114b can then be back filled with metal to form metal portions 116a and 116b. The recesses 114a and 114b can be back filled using PVD, CVD, ALD, or any other suitable method of deposition. According to embodiments of the invention, the metal portions 116a and 116b can comprise titanium, titanium nitride, tantalum, tantalum nitride, aluminum, tungsten, or any other suitable metal or metal alloy. Additionally, the metal portions 116a and 116b can also comprise any combination of suitable metals or metal alloys. Chemical mechanical polish (CMP) may be needed to planarize the surface and leave the metal in the trench. An inter-layer dielectric (ILD) layer can be formed on top of the polysilicon layer 110, spacers 112, and metal portions 116a and 116b. According to some embodiments, the ILD is on the order of 70-80 nanometers thick, however, other thickness may be used depending on the particular process and application.

Figure 1D:
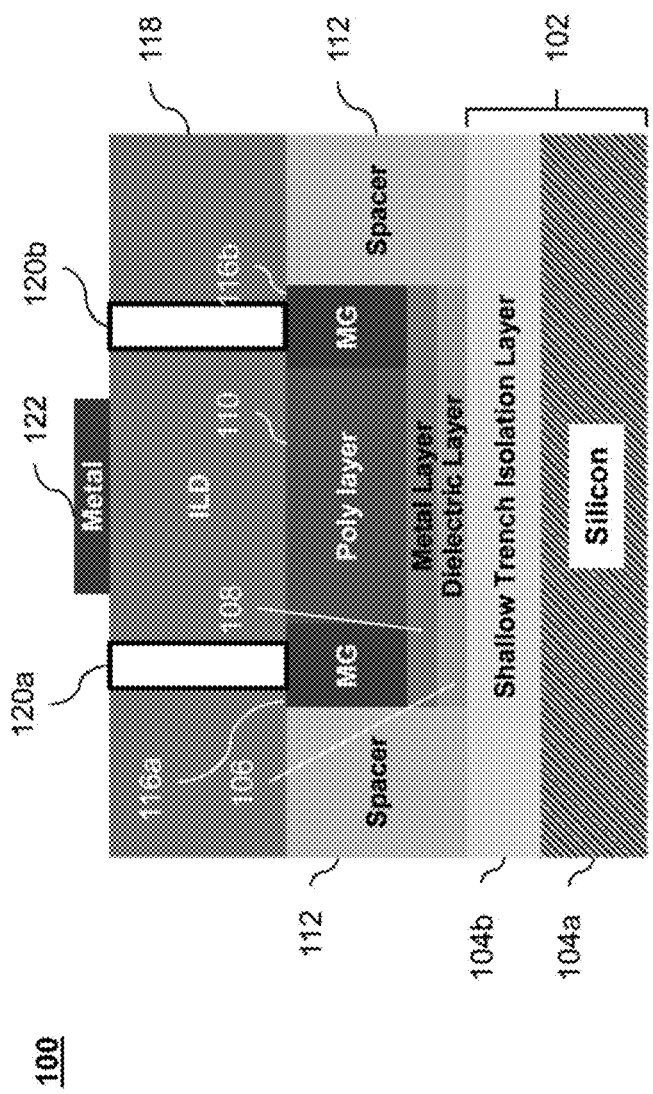
FIG. 1d depicts a field transistor structure according to embodiments of the present invention.

FIG. 1d depicts a completed field transistor structure 100 according to embodiments of the present invention. As can be seen, the completed field transistor structure 100 includes contacts 120a and 120b, which are formed through the ILD 118. Each of the contacts 120a and 120b corresponds to a metal portion 116a and 116b and is electrically coupled to it. The completed field transistor structure 100 also includes a metal gate portion 122 formed on top of the ILD layer 118. The polysilicon layer 110 includes first, second, third, and fourth sides, where: the polysilicon layer is disposed between the semiconductor substrate on the first side and the metal gate on said second side; and where the polysilicon layer 110 is disposed between the first and second metal portions 116a and 116b on the third and fourth sides. More specifically: the bottom surface (or first side) of the polysilicon layer 110 is in direct contact with the top surface of the metal layer 108; the top surface (or second side) of the polysilicon layer 110 is in direct contact with the bottom surface of the ILD layer 110; the first side surface (third side) of the polysilicon layer 110 is in direct contact with the first metal portion 116a; and the second side surface (fourth side) of the polysilicon layer 110 is in direct contact with the second metal portion 116b.

Figure 2:
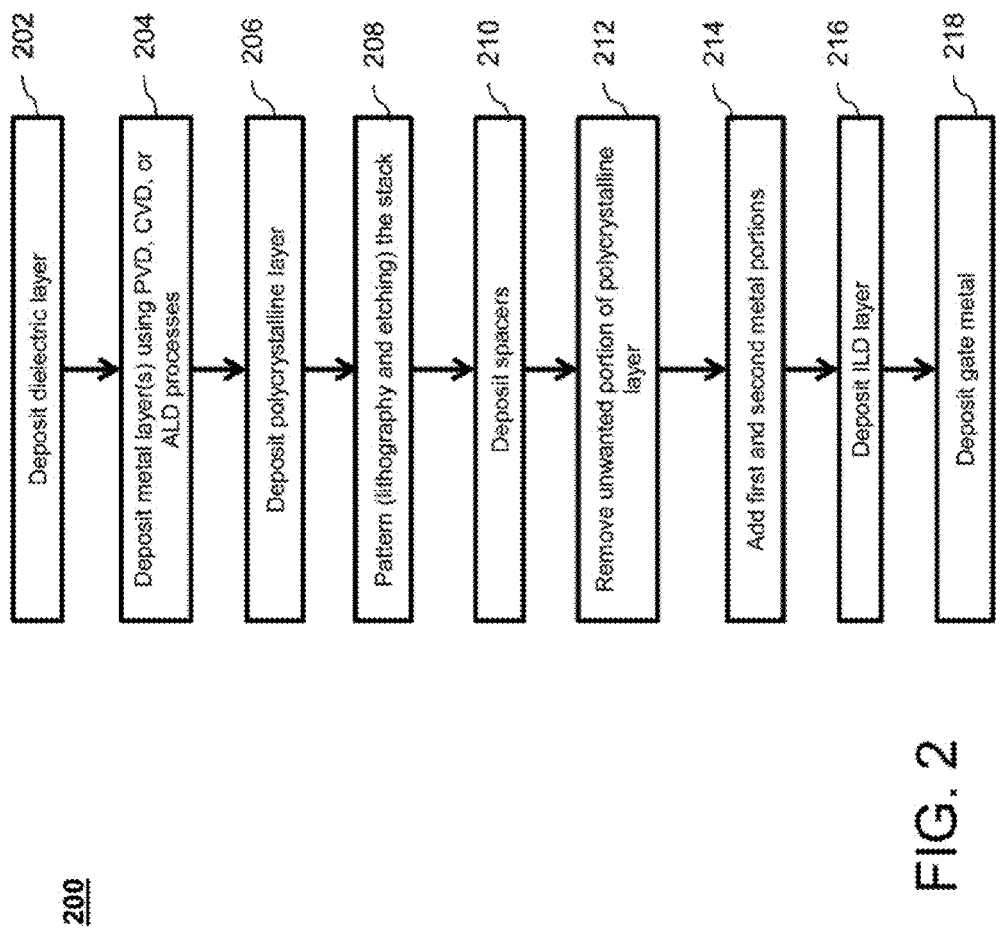
FIG. 2 is a flow chart depicting a process for making a field transistor structure according to embodiments of the present invention.

FIG. 2 is a flowchart depicting a process 200 for making the field transistor structure 100 according to embodiments of the present invention. This process will be described with reference to FIGS. 1a-d and FIG. 2. As shown in FIG. 2, a dielectric layer 106 is deposited on a silicon substrate 102 at step 202. According to embodiments of the present invention, the silicon substrate 102 may comprise a silicon layer 104a or a silicon layer 104a and an STI layer 104b.

At step 204, a metal layer 108 is deposited on top of the dielectric layer 106. According to embodiments of the present invention, the metal layer 108 may be deposited by using PVD, CVD, ALD, or any other appropriate process for metal deposition. The metal layer 108 may also include any appropriate metal such as titanium, titanium nitride, tantalum, tantalum nitride, aluminum, tungsten, or any other suitable metal or metal alloy. The metal layer 108 may also comprise a combination of suitable metals or alloys.

At step 206, a polysilicon layer 110 is deposited on top of the metal layer 108. The polysilicon layer 110 is preferably un-doped or very lightly doped (i.e., on the order of $10^{13}$ atoms/cm$^3$). At step 208, the transistor structure 100 can be patterned using lithography and etching. Spacers 112 can be defined by a combination of deposition, lithography, etching, and CMP (chemical mechanical polishing) at step 210, and a portion of the polysilicon layer 110 can then be removed to form recesses 114a and 114b at step 212. Additionally, a portion of the metal layer 108 corresponding to the portion of the polysilicon layer 110 that was removed can also be removed according to embodiments of the present invention.

The recesses 114a and 114b can be backfilled with metal to form first and second metal portions 116a and 116b at step 214. An ILD 118 may then be deposited and contacts 120a and 120b formed through the ILD and electrically coupled to the first and second metal portions 116a and 116b, respectively at step 216. A metal gate 122 may be deposited on ILD 118 and patterned at step 218 to complete the formation of the field transistor structure.

Figure 3:
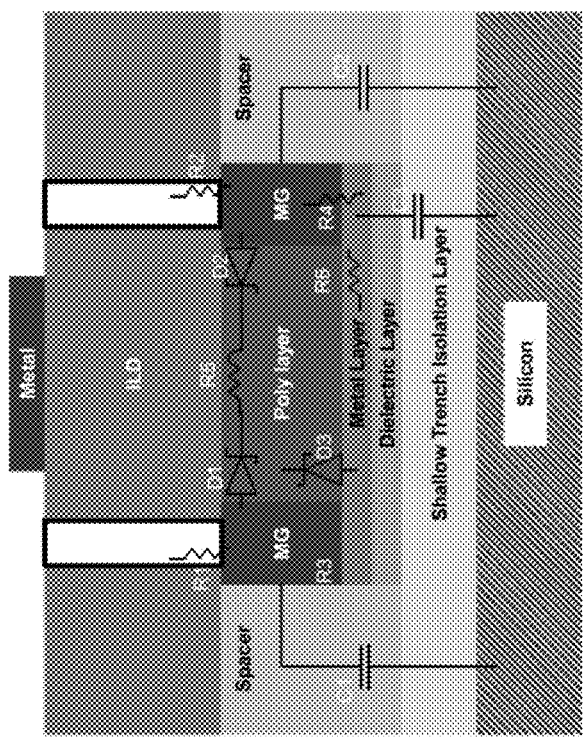
FIG. 3 is a depiction of the conventional circuit components used to model the field transistor structure according to embodiments of the present invention.

FIG. 3 illustrates a circuit model 300 of the field transistor structure according to embodiments of the present invention. Because it is non-ohmic, the interface between the metal portions and the poly layer can be modeled using Schottky diodes D1 and D2. The resistance of the poly layer is modeled by resistor R5. The value of R5 is a function of the metal gate voltage and the frequency of the signal between the source and the drain. Capacitors C1 and C2 are used to model the parasitic capacitance between the metal portions and the substrate. Capacitor C3 is used to model the parasitic capacitance between the metal layer and the substrate. Resistors R1 and R2 model the resistance between the contacts and the MG layers. R3 and R4 model the resistance between the metal portions and the metal layer. R6 models the resistance of the thin metal layer. According to embodiments of the present invention, R6 is large due to the thinness of the thin metal layer. R5, however, can be much larger than R6 as much as 2 or 3 orders of magnitude, according to some embodiments.

Figure 4:
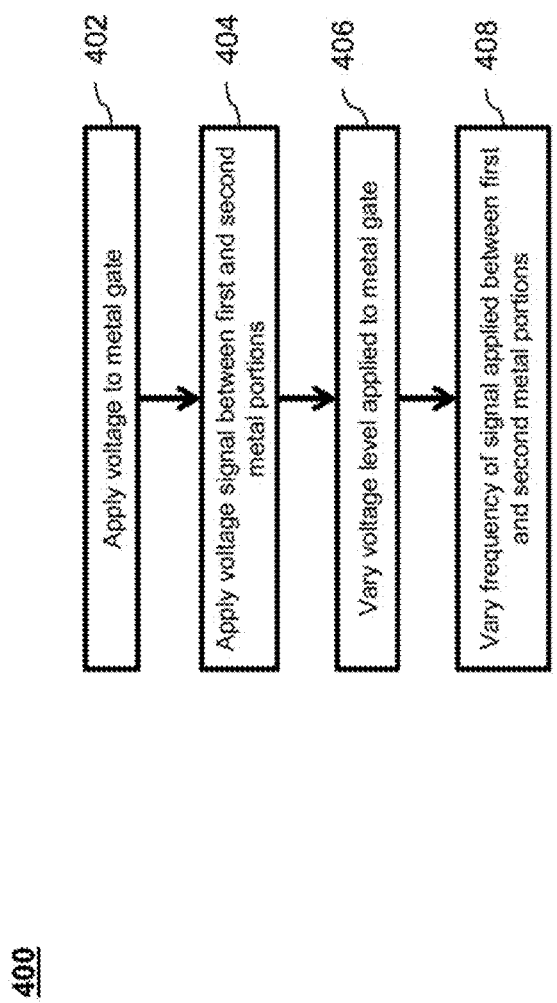
FIG. 4 is a flow chart depicting a method of using the field transistor structure according to embodiments of the present invention.

FIG. 4 illustrates a method 400 of using the field transistor structure 100 according to embodiments of the present invention. As is shown if FIG. 4, a voltage is applied to the metal gate portion 122. Next a signal is applied between the first and second metal portions 116a and 116b at step 404. The voltage level applied to the metal gate 122 can be varied to modify the resistance of the poly layer 110 at step 406. Finally, the frequency of the signal applied between the first and second metal portions 116a and 116b can be varied to change the resistance of the poly layer 110 at step 406.

In general, the un-doped or lightly doped polysilicon layer 110 of the present invention exhibits very high electrical resistance. However, voltage applied to metal gate 122 induces a charge in the polysilicon layer 110 by both inversion and accumulation, to create a channel for conduction. This modulates the resistance of the polysilicon layer 110 so that the structure can be used as a field effect transistor (FET) when voltage is applied to the gate, described further below. As the voltage applied to metal gate 112 increases, the induced charge in the polysilicon increases and the resistance of the polysilicon layer 110 is decreased; the resistance of the polysilicon layer and the voltage applied to the gate metal 122 have an inverse relationship. Further, maintaining a constant voltage on the gate, will maintain a constant resistance. Thin metal layer 108 has a very high resistance because it is so thin, and therefore does not impede the transistor features once the channel is created even though the thin metal layer 108 provides a parallel electrical path between the source and drain.

Figure 5:
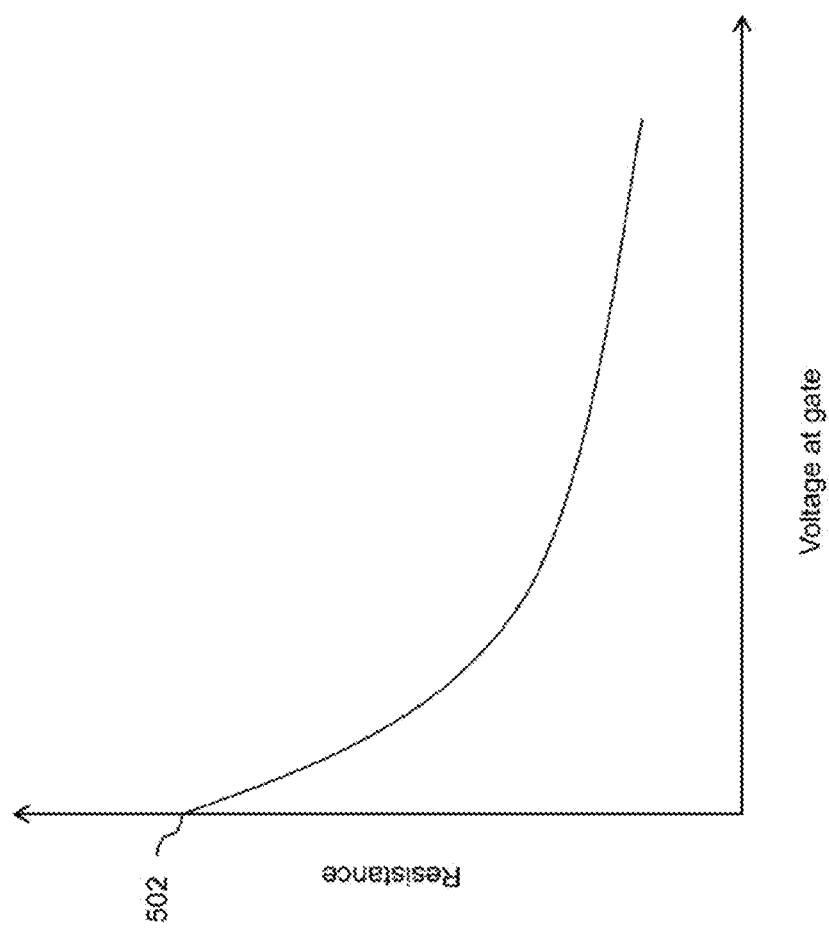
FIG. 5 is a graph depicting the resistance of the polysilicon as a function of the voltage applied to the gate metal according to embodiments of the present invention.

The relationship between the resistance of the polysilicon layer and the applied gate voltage is shown in FIG. 5. As can be seen in FIG. 5, the resistance begins at a high value 502 when no voltage is applied to the gate. However, as the applied voltage increases, the resistance decreases. For instance, according to some applications, the resistance value can change several percentage points when the gate voltage falls below 3V.

Another salient feature of the field transistor structure 100 according to embodiments of the present invention is that the resistance of the polysilicon also varies with the frequency of a voltage signal applied between the source 116a and the drain 116b. The un-doped or lightly doped polysilicon layer 110 exhibits high resistance when a relatively low frequency voltage signal is applied between the source 116a and drain 116b, and a lower resistance when a higher frequency voltage signal is applied between the source 116a and drain 116b. Maintaining a constant frequency signal, will maintain a relatively constant resistivity, all other factors remaining the same. Further the variation in resistance of the polysilicon with frequency can be overcome or compensated by adjusting the gate voltage. For example, if the input signal to the source/drain 116 changes in frequency from high to low, then the conductivity of the polysilicon 110 can be maintained by increasing the voltage on metal gate 122, assuming there is headroom to do so. Similarly, if the input signal to the source/drain 116 changes in frequency from low to high, then the conductivity of the polysilicon 110 can be maintained by decreasing the voltage on metal gate 122, assuming there is headroom to do so.

Figure 6:
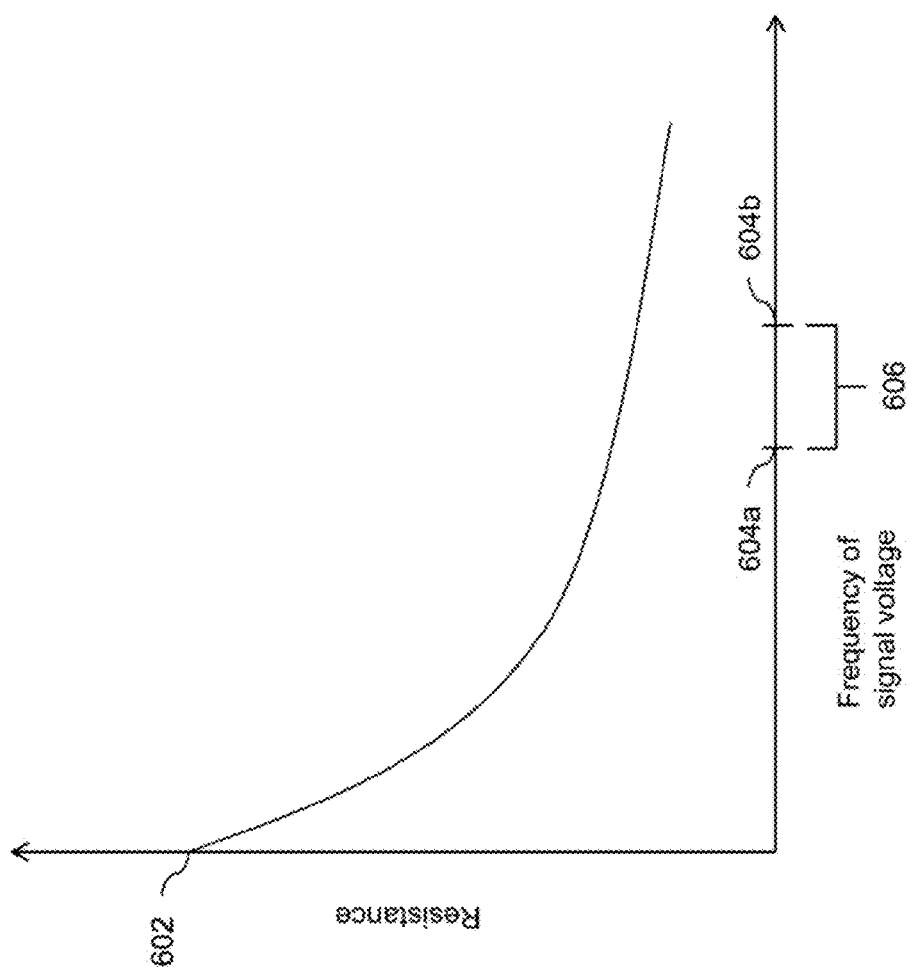
FIG. 6 is a graph depicting the resistance of the polysilicon as a function of the frequency of a signal applied between a source and a drain of a transistor structure according to embodiments of the present invention.

This relationship between the resistance of the polysilicon layer 110 and the frequency of the voltage signal applied between the source 116a and the drain 116b is graphically shown in FIG. 6. As can be seen in FIG. 6, the polysilicon layer 110 exhibits a high resistance 602 when the frequency of the applied voltage signal is low (e.g., a DC voltage). As the frequency increases, however, the resistance decreases. For instance, according to some embodiments, the resistance can change by several percentage points when the frequency increases to the RF spectrum compared to lower frequencies.

Field Transistor Structure Functional Uses

Completed field transistor structure 100 is operable as a field effect transistor (FET), as described above. In this operation, the metal portions 116a and 116b are operable as the source and drain, respectively, and connected through metal contacts 120a and 120b. The metal gate portion 122 can operate as a transistor gate, so that a voltage applied to the gate 122 creates a channel in the polysilicon layer for current flow. The transistor structure 100 is capable of operating as a FET due to the characteristic of the un-doped/lightly doped polysilicon layer 110. The formed channel is not as low resistance as would be with a thin gate dielectric, but it is functional for circuit applications that do not require high FET performance. Further, as discussed above, the thin metal layer 108 provides a parallel current path between the source and drain 116. The resistance change due to applied gate voltage can be significant compared to the thin metal resistance, and therefore does not degrade the FET performance once a gate voltage is applied and the channel is formed.

Figure 7:
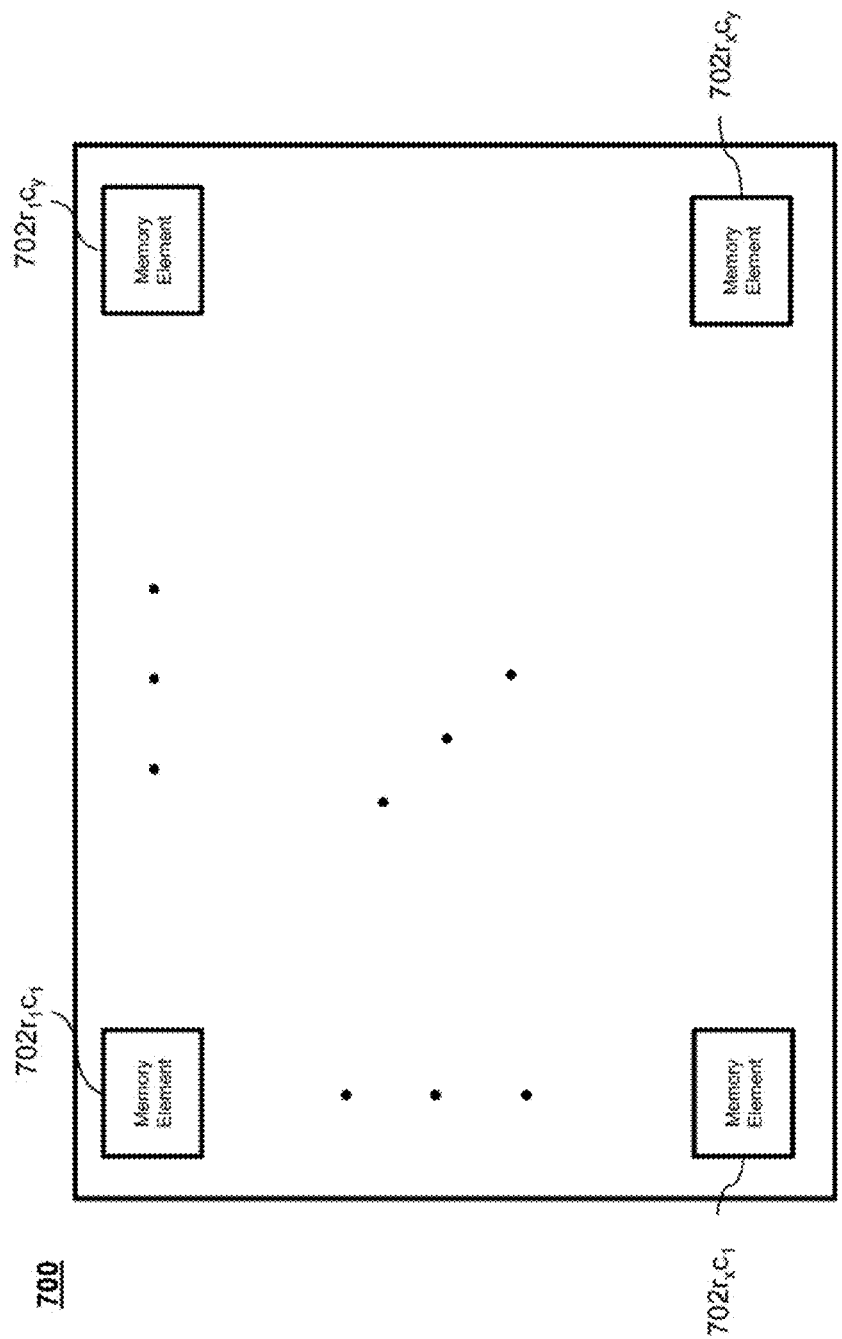
FIG. 7 is a functional block diagram of a one-time programmable memory according to embodiments of the present invention.

According to embodiments of the present invention, the transistor structure 100 can be used as a component of a one-time programmable (OTP) device. FIG. 7 illustrates an OTP device 700 according to embodiments of the present invention. As is shown in the functional block diagram of FIG. 7, the device 700 can include a number of programmable elements $702r_1c_1$ to $702r_xc_y$. Each of the device elements comprises a transistor structure 100 such as that depicted in FIG. 1d.

The individual elements 702 can be programmed by connecting a large voltage across metal portions 116a and 116b, to force a large current through the metal layer 108. As noted above, the metal layer 108 provides an electrical connection between metal portions 116a and 116b, that has a high resistance. Accordingly, applying a high current to the thin metal layer 108 can cause the thin metal layer 108 to behave like a fuse and blow due to heating. That is, the thin metal layer 108, according to some embodiments, entirely severs the electrical connection that it created between metal portions 116a and 116b upon application of high current. According to other embodiments, the electrical connection between 116a and 116b created by the thin metal layer remains, but the resistance of the thin metal layer is greatly increased in response to application of high current. Therefore, post high current, the impedance from source-to-drain 116 of the device will significantly change, so that it can be used as a fuse or OTP memory. When operating as a OTP memory, the thin metal layer operates as a fuse that may be blown where a binary zero is to be stored, and remain unaltered where a binary one is to be stored. The binary-zero/binary-one representations may be reversed as will be understood by those skilled in the art. (i.e. the blown fuse could represent a binary 1, and the intact option represents a binary 0) The memory can be subsequently read by measuring the impedance across the source drain contacts.

According to embodiments of the present invention, the transistor structure 100 can be used as a high resistance resistor, and more specifically a frequency dependent resistor. The polysilicon layer 110 is low doped and has an inherently high resistance when no gate voltage is applied to the metal gate 122. Therefore, the source/drain contacts 120a,b can be used a high resistance resistor in an IC device. Further, the resistor is frequency dependent due to the properties of the polysilicon/metal interface described herein, and therefore a frequency dependent resistor can be created simply by adjusting the frequency of the input signal applied to the source/drain contacts 120a,b.

CONCLUSION

It is to be appreciated that the Detailed Description section, and not the Abstract section, is intended to be used to interpret the claims. The Abstract section may set forth one or more, but not all exemplary embodiments, of the invention, and thus, are not intended to limit the invention and the appended claims in any way.

The invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the following claims and their equivalents.

What is claimed is:

1. A field transistor structure, comprising:
   a semiconductor substrate;
   a metal gate;
   first and second metal portions;
   a polysilicon layer having first, second, third, and fourth sides, wherein the polysilicon layer is disposed between the semiconductor substrate on the first side and the metal gate on the second side, wherein the polysilicon layer is disposed between and in contact with the first and second metal portions on the third and fourth sides; and
   a thin metal layer disclosed between the polysilicon layer and the semiconductor substrate.

2. The field transistor structure of claim 1, wherein the thin metal layer electrically couples the first and second metal portions to each other.

3. The field transistor structure of claim 1, wherein the thin metal layer is configured to increase its resistance in response to a high current being applied between the first and second metal portions.

4. The field transistor structure of claim 1, further comprising an inter-layer dielectric (ILD) disposed between the metal gate and the polysilicon layer.

5. The field transistor structure of claim 1, wherein a conductance of the polysilicon layer between the first and second metal portions varies with a voltage applied to the metal gate.

6. The field transistor structure of claim 1, wherein a conductance of the polysilicon layer between the first and second metal portions varies with a frequency of a signal applied between the first and second metal portions.

7. The field transistor structure of claim 1, wherein one or more of the first and second metal portions and the metal gate comprise Ti, TiN, TaN, AL, Ta, Mo, or W.

8. The field transistor structure of claim 1, wherein the polysilicon layer is lightly doped.

9. The field transistor structure of claim 1, wherein the polysilicon layer is an intrinsic semiconductor.

10. The field transistor structure of claim 1, further comprising a dielectric layer disposed between the thin metal layer and the semiconductor substrate.

11. The field transistor structure of claim 10, wherein the dielectric layer is a hi-k material, oxide, nitride, or oxinitride, or their combination.

12. The field transistor structure of claim 10, further comprising a shallow trench isolation (STI) layer disposed between the dielectric layer and the semiconductor substrate.

13. The field transistor structure of claim 1, wherein a conductive channel is formed in the polysilicon layer when a gate voltage is applied to the metal gate, thereby forming a field effect transistor having the first and second metal portions operate as a respective source and drain of the field effect transistor.

14. The field transistor structure of claim 1, wherein the thin metal layer changes impedance with the application of a high current to the first and second metal portions, thereby forming a one-time programmable (OTP) memory.

15. The field transistor structure of 1, wherein the polysilicon layer is disposed completely between the first and second metal portions.

16. A semiconductor device, comprising:
a semiconductor substrate;
a first metal portion disposed on the semiconductor substrate and having a first sidewall;
a second metal portion disposed on the semiconductor substrate and having a second sidewall;
a polysilicon layer having a third sidewall in contact with the first sidewall and a fourth sidewall in contact with the second sidewall; and
a thin metal layer disposed between the polysilicon layer and the semiconductor substrate.

17. The semiconductor device of claim 16, wherein the polysilicon layer is disposed completely between the first and second metal portions.

18. The semiconductor device of claim 16, wherein the thin metal layer electrically couples the first metal portion to the second metal portion.

19. The semiconductor device of claim 16, wherein the thin metal layer is configured to increase its resistance in response to an application of a high current between the first metal portion and the second metal portion.

20. The semiconductor device of claim 16, further comprising a metal gate.

21. The semiconductor device of claim 20, wherein a conductance of the polysilicon layer is configured to vary with a voltage applied to the metal gate.

22. The semiconductor device of claim 16, wherein a conductance of the polysilicon layer varies with a frequency of a signal applied between the first and second metal portions.

23. The semiconductor device of claim 16, further comprising an inter-layer dielectric disposed between the metal gate and the polysilicon layer.

* * * * *